US010396723B1

(12) United States Patent
Haas et al.

(10) Patent No.: US 10,396,723 B1
(45) Date of Patent: Aug. 27, 2019

(54) MULTIRATE, ITERATIVE, MEMORY POLYNOMIAL BASED MODELING AND PRE-DISTORTION OF HIGH BANDWIDTH POWER AMPLIFIERS

(71) Applicant: NORTHROP GRUMMAN SYSTEMS CORPORATION, Falls Church, VA (US)

(72) Inventors: Daniel Haas, Pasadena, CA (US); Peter Ly, Escondido, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 15/942,134

(22) Filed: Mar. 30, 2018

(51) Int. Cl.
*H04B 1/04* (2006.01)
*H03F 1/32* (2006.01)

(52) U.S. Cl.
CPC ......... *H03F 1/3258* (2013.01); *H03F 1/3247* (2013.01)

(58) Field of Classification Search
CPC .... H03F 1/3258; H03F 1/3247; H03F 1/3241; H03F 2201/3233; H04B 2001/0425; H04L 27/368
See application file for complete search history.

(56) References Cited

U.S. PATENT DOCUMENTS 7,095,278 B2 8/2006 Fuller et al.
7,746,955 B2 6/2010 Rexberg
2003/0058959 A1* 3/2003 Rafie ..................... H03F 1/3247 375/296
2010/0246716 A1* 9/2010 Wang ..................... H04L 27/362 375/298
2012/0064847 A1* 3/2012 Xu ..................... H04B 1/0475 455/114.3
2014/0139287 A1* 5/2014 Oishi ..................... H03F 3/24 330/149
2015/0054579 A1 2/2015 Omer et al.

(Continued)

OTHER PUBLICATIONS

Morgan, Dennis R.; MA, Zhengxiang; Kim, Jaehyeong; Zierdt, Michael G.; Pastalan, John; "A Generalized Memory Polynomial Model for Digital Predistortion of RF Power Amplifiers"; Oct. 2006; pp. 3852-3860; IEEE Transactions on Signal Processing vol. 54 No. 10; 1053-587X; IEEE.

(Continued)

*Primary Examiner* — David S Huang
(74) *Attorney, Agent, or Firm* — John A. Miller; Shumaker, Loop & Kendrick, LLP

(57) ABSTRACT

A system and method for pre-distorting a digital signal in a digital communications system. The method includes converting digital bits to be transmitted to a series of symbols defining the bits and providing the symbols to a pulse shaping filter (PSF) that provides samples of the symbols at a predetermined sample rate. The method also includes providing the filtered samples to a pre-distorter that pre-distorts the samples, wherein pre-distorting the samples includes providing a non-linear transformation of the samples that is defined by pre-distorter taps, and providing the pre-distorted samples to a power amplifier to be transmitted, where pre-distorting the samples includes modeling the power amplifier and associated transmitter components using a degree three memory polynomial.

21 Claims, 2 Drawing Sheets

(56) References Cited

U.S. PATENT DOCUMENTS

| | | | |
|---|---|---|---|
| 2016/0218752 | A1 | 7/2016 | Liu |
| 2017/0033809 | A1 | 2/2017 | Liu |

OTHER PUBLICATIONS

Benedetto, S.; Biglieri, E.; Daffara, R.; "Modeling and Performance Evaluation of Nonlinear Satellite Links—A Volterra Series Approach"; Jul. 1979; pp. 494-507; IEEE Transactions on Aerospace and Electronic Systems vol. AES-15, No. 4; 0018-9251/79/0700-0494; IEEE.

Ding, Lei; Zhou, G. Tong; Morgan, Dennis R.; MA, Zhengxiang; Kenney, J. Stevenson; Kim, Jaehyeong; Giardina, Charles R.; "A Robust Digital Baseband Predistorter Constructed Using Memory Polynomials"; Jan. 2004; pp. 159-165; IEEE Transactions on Communications, vol. 52, No. 1; DOI 10.1109/TCOMM.2003.822188; 0090-6778/04; IEEE.

* cited by examiner

MULTIRATE, ITERATIVE, MEMORY POLYNOMIAL BASED MODELING AND PRE-DISTORTION OF HIGH BANDWIDTH POWER AMPLIFIERS

GOVERNMENT CONTRACT

The Government of the United States of America has rights in this invention pursuant to a U.S. Government contract.

BACKGROUND

Field

This invention relates generally to a system and method for pre-distorting a digital signal prior to being amplified by a high power amplifier (HPA) to reduce or eliminate non-linear or memory effect distortions caused by the amplifier and, more particularly, to a system and method for pre-distorting a digital signal prior to being amplified by an HPA to reduce or eliminate non-linear or memory effect distortions caused by the amplifier, where the pre-distortion employs modeling the HPA and associated components using a multi-rate, iterative memory polynomial model.

Discussion

Satellite communications is seeing a growing demand for greater throughput and transponders with more power efficiency. In order to meet the radiated power demands necessary for the signal transmission distances, satellite communications systems, as well as other wireless communications systems, typically employ high power amplifiers (HPAs), such as traveling-wave tube amplifiers (TWTAs) or solid-state power amplifiers (SSPA). To provide high throughput and increased efficiency, these HPAs often operate at or near their saturation level, which typically results in significant non-linear distortions of the transmitted signal that has a reverse effect on the throughput and performance of the communications channel.

There are two basic reasons why an HPA operates at its saturation limit. First, communications over large distances requires the power amplifier to transmit with as much power as it can. Second, known power amplifiers have a design characteristic where the amount of power they consume is independent of the amount of power they expend via their output terminal. Thus, if the amount of power the amplifier expends via its output terminal is not maximized, the amplifier ends up expending the remaining power via heat. This heat increases the temperature of not only the power amplifier, but also the surrounding electronics, which can seriously degrade their performance.

In a typical wireless digital signal transmitter for satellite communications or otherwise, the transmitter includes digital components that convert the digital bits at a particular point in time into an in-phase and quadrature-phase symbol constellation for transmission. These symbols are mapped to corresponding analog signals that modulate a carrier, and the aggregate is radiated via a high power amplifier. Since the power amplifier is typically operated near saturation it ends up distorting the transmitted signal. As a result, some type of signal correction is typically required.

It has been proposed in the art that, prior to passing a signal through the power amplifier and, while still in the digital domain, reshaping the signal using a digital signal processing operation that tries to undo the distortion caused by the power amplifier. This process is referred to as pre-distortion.

Various approaches to pre-distortion are known in the art. In one known process, referred to as symbol pre-distortion, the symbols themselves are modified. However, this technique has limited performance and throughput. A more powerful approach is referred to as sample pre-distortion, where the signal samples themselves are directly reshaped. Sample pre-distortion offers the capacity to correct for wider bandwidth and more prevalent non-linear and memory distortions caused by the high power amplifier.

DETAILED DESCRIPTION OF THE EMBODIMENTS

The following discussion of the embodiments of the invention directed to a system and method for pre-distorting a signal prior to being amplified by an HPA to reduce or eliminate non-linear and/or memory effect distortions caused by the amplifier, where the pre-distortion employs a multi-rate, iterative memory polynomial model, is merely exemplary in nature, and is in no way intended to limit the invention or its applications or uses.

Figure 1:
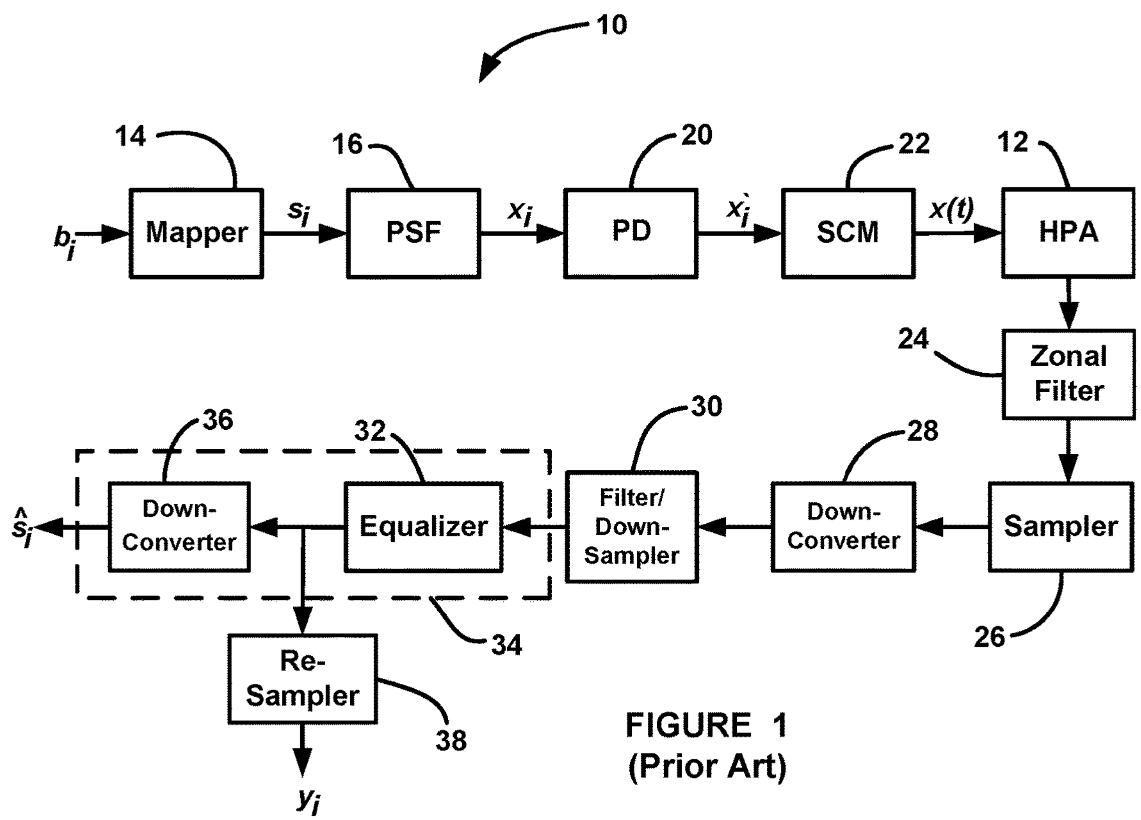
FIG. 1 is a block diagram of a known communications system employing a high power amplifier.

FIG. 1 is a block diagram of a known communications system 10 employing a high power amplifier (HPA) 12. A sequence of bits $b_i$ to be transmitted is provided to a mapper 14 that converts the bits $b_i$ to a sequence of symbols $s_i$, where each symbol $s_i$ is a complex number in the form of, for example, an amplitude phase shift keying (APSK) constellation, such as quadrature phase shift keying (QPSK), 16-APSK, 32-APSK, etc. The symbols $s_i$ are sent to a square-root raised cosine (SRRC) pulse shaping filter (PSF) 16 that outputs samples $x_i$ of the associated complex baseband signal at a predetermined rate, such as 3/2 samples $x_i$ per symbol $s_i$, such that the output of the PSF 16 is a sequence of complex numbers $x_i$ that are samples of the complex baseband signal. The complex samples $x_i$ are then passed through a pre-distorter (PD) 20 that provides digital pre-distortion of the samples $x_i$, and outputs a sequence of complex samples $x'_i$, where the pre-distorter output is at the same rate as its input. The pre-distorted complex baseband sample $x'_i$ is sent to a single chip modulator (SCM) chip 22 that performs two operations at once. Specifically, the chip 22 operates as a digital-to-analog (D/A) converter and simultaneously modulates the carrier, thus producing the signal x(t) that is fed to the HPA 12.

The signal x(t) is then amplified by the HPA 12 and filtered by a zonal filter 24 centered at the carrier frequency to discard harmonics added by the power amplifier nonlinearities. The signal is sampled at box 26, at, for example, 80 Gsam/sec, which converts the analog signal back to a digital signal, down-converted to a complex baseband at box 28, and match filtered at box 30. The filtered signal from the box 30 is then sent to an equalizer 32 in an error vector magnitude (EVM) receiver 34 that generates symbol estimates $\hat{s}_i$. Additionally, the output from the equalizer 32 is resampled at box 38 to generate the output samples $y_i$ at a rate equal to the output of the PSF 16.

The EVM receiver 34 is provided with the true transmitted symbols $s_i$ so that its equalizer operates optimally. Providing the EVM receiver 34 with the true transmitted symbols enables the receiver 34 to quantify the degrading effect of the power amplifier non-linearities, not the imperfections of the equalizer 32. The natural measure for the transmitter performance is the quality of the symbol estimates $\hat{s}_i$ at the output of the receiver 34. This measure is quantified by determining the EVM at the output of the receiver 34, a measure discussed next.

First, N is written for the number of symbols $s_i$ that are transmitted, where each symbol $s_i$ is picked from a constellation of size K. The true transmitted symbols $s_i$ and the corresponding estimated symbols $s_i$ are both provided at the output of the receiver 34, and the EVM is computed via:

$$EVM \stackrel{def}{=} \sqrt{\frac{\frac{1}{N}\sum_i |s_i - \hat{s}_i|^2}{\frac{1}{K}\sum_i |s_i|^2}}, \tag{1}$$

where the numerator is summed over all transmitted symbols and the denominator is summer over all symbols in the constellation. The EVM is the ratio of the rms of the symbol estimate residuals and the square root of the average symbol energy.

The PD 20 is a non-linear transformation determined by a number of parameters, which are referred to as PD taps, where the PD taps are determined iteratively. In order to determine the optimal PD taps, the PD 20 is taken out of the signal chain and a mathematical model is generated relating the output $x_i$ of the PSF 16 and the output $y_i$ of the EVM receiver 34. This model is described next.

In the subsequent discussion, for notational convenience, the output $x_i$ of the PSF 16 and the output $y_i$ of the EVM receiver 34 shall be denoted x(n) and y(n). The model that relates y(n) to x(n) is taken to be a third order, odd term only, memory polynomial model, given by:

$$y(n) = \sum_{k=0,2}\sum_{m=0}^{Q-1} a_{km} x(n-m)|x(n-m)|^k. \tag{2}$$

Figure 2:
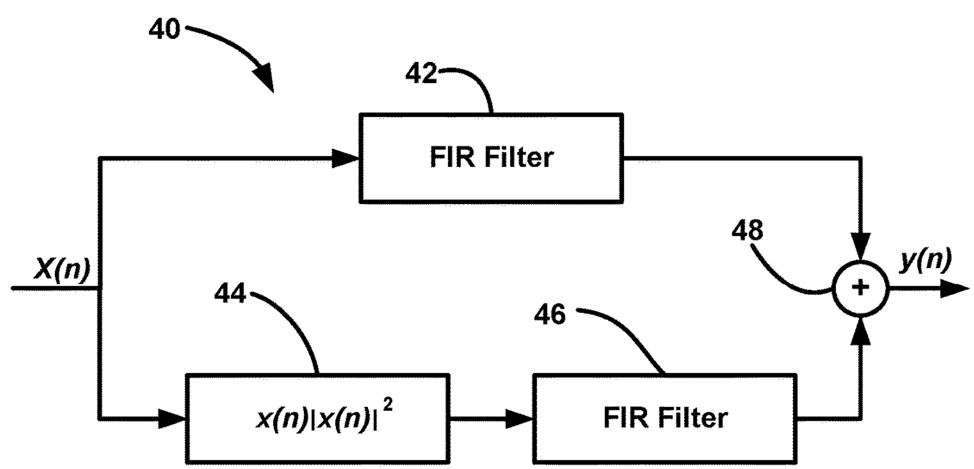
FIG. 2 is a block diagram of an architecture of a third order, odd term, memory polynomial.

Equation (2) is a linear combination of the output of two finite impulse response (FIR) filters with one filter having as its input the complex baseband signal x(n), and the other filter having its input the "cubed" signal $x(n)|x(n)|^2$. FIG. 2 is a block diagram of an architecture 40 that receives the complex baseband signal which is filtered by an FIR filter 42 and is cubed at box 44 as referred to above. The cubed complex baseband signal is then filtered by another FIR filter 46 and the two filtered signals are added by summation junction 48 to obtain the signal y(n).

Determining the coefficients $a_{km}$ of the model of equation (2) is straight forward. The baseband signals x (n) and y(n) are first aligned in time. Equation (2) is then simply an over-determined set of linear equations that can be solved for the coefficients $a_{km}$. The resulting model is referred to as the power amplifier (PA) model, and is used to determine the pre-distortion taps.

The PD 20, like the PA model, is taken to be a third order, odd term only, memory polynomial. For the determination of the PD taps, the value ϕ is first written for the PA model. The goal of the PD 20 is to invert the PA model on the left. That is, the PD 20 attempts to ensure that the composition $$x(n) \xrightarrow{PD} x'(n) \xrightarrow{\phi} y(n)$$

is the identity map, in a manner to be described next.

Ultimately, the goal of the PD 20 is to enable the most accurate symbol estimates. Thus, a symbol estimate module ε is constructed that takes in the complex baseband signal y(n) and generates the symbol estimates $\hat{s}_i$. The pre-distorter map is then designed such that the output of the sequence of maps shown in FIG. 3 generates as accurate symbol estimates ŝ_i as possible.

Figure 3:
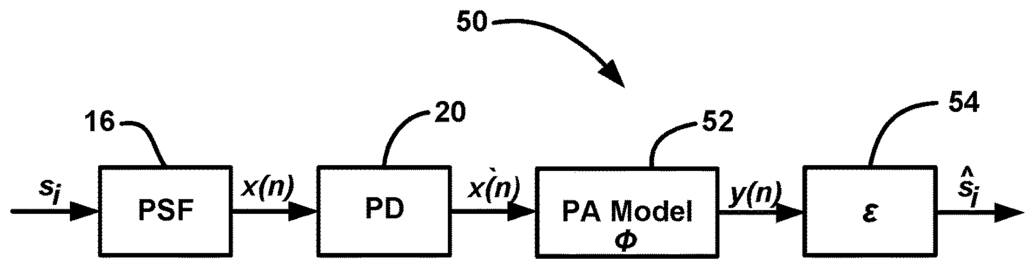
FIG. 3 is a block diagram of a power amplifier model.

FIG. 3 is a block diagram of a system model 50 illustrating the above-described modeling, where the system model 50 shows the PSF 16 and the PD 20. The system model 50 also includes the PA model at box 52 and the symbol estimate module ε at box 54 that generates the symbol estimates $\hat{s}_i$ based on the complex baseband signal y(n) from the PA model. It is noted that the symbol estimate module ε is intended to represent the EVM receiver 34.

The algorithm determining the PD taps will be iterative and will need an initial, though not final, taps estimate. The initial PD taps estimate is generated using an approach known in the art as indirect learning, which is described next.

Instead of asking the PD 20 to invert the PA map on the left, as described above, one could ask the PD 20 to invert the PA map on the right. That is, suppose the PD 20 is determined such that the following composition is the identity map on x(n):

$$x(n) \xrightarrow{\phi} y(n) \xrightarrow{PD} x(n). \tag{3}$$

The idea of indirect learning is then to take this right inverse and use it as the left inverse. Note that since both the pre-distorter map and the PA model are nonlinear, they do not commute as they would had they been simply LTI systems, such as FIR filters. However, it is noted that the right inverse of the PA model ϕ is, more or less, a decent left inverse as well. It is further noted that determining the right inverse of the PA model ϕ on the right is straight forward since, in parallel fashion as for equation (2), solving for the pre-distorter taps that invert the PA model ϕ on the right is asking for the coefficients solving the system of linear equations:

$$x(n) = \sum_{k=0,2}\sum_{m=0}^{Q-1} a_{km} y(n-m)|y(n-m)|^k. \tag{4}$$

This system of linear equations is easily solvable and is the reason it is common in previous approaches in the literature for indirect learning to be used to form the PD taps.

However, the PD taps, as determined by indirect learning, can be improved, as described next.

Having determined, using indirect learning, the first guess for the pre-distorter taps, they now can be optimized. Recall that the aim of the PD 20 is to give the best symbol estimates possible, that is, to give as small an EVM as possible. This is performed by the classical Gauss-Newton model fit process, which is designed for precisely this kind of situation. A measure is formed to be minimized, in this work the EVM. The EVM is a function of the pre-distorter taps. Conceptually, each of the pre-distorter taps is wiggled to take the derivative of the EVM with respect to each of the taps, thus determining the gradient. Walking down error surface in the direction of the gradient, reduces the EVM. However, such a gradient descent approach converges somewhat slowly. The Gauss-Newton algorithm is a suped-up version of the gradient decent algorithm, which assumes that the initial guess is good enough to enable the second order derivative of the error surface to be used. In such a fashion, the Gauss-Newton algorithm is able to optimize its step size, achieving faster convergence. Specifically, if $P_i$ is written for the pre-distorter taps at iteration i of the Gauss-Newton fit, then at the i+1'st iteration, the pre-distorter taps are:

$$p_{i+1}=p_i-H^{-1}\cdot\nabla x^2(p_i), \quad (5)$$

where H is the Hessian of the $x^2$ measure (EVM in this case) and $\nabla x^2(p_i)$ is its gradient at iteration i.

The pre-distorter tap determination algorithm can be improved in two key ways. Both the PA model and the PD 20 are taken as degree three memory polynomials. In particular, they are each formed out of two branches with each branch containing an FIR filter. It will be now shown that it is advantageous to optimize the FIR filter taps of both the PA model and the PD 20 under a restriction to be described. Further, it will be shown that increasing the sampling rate at the output of the PSF 16 beyond the Nyquist rate is advantageous. To explain the FIR filter taps restriction and the optimal PSF 16 sampling rate, two points need to be explained.

First, note that the input to the PD 20 is the output of the PSF 16, where the output of the PSF 16 is a discrete complex baseband signal generated using $\eta$ samples per symbol, for some $\eta$. It is noted that the Nyquist sampling rate for the PSF 16 with bandwidth expansion factor $\alpha$ is $1+\alpha$ samples per symbol. For example, a bandwidth expansion factor of $\alpha=0.3$ would result in a Nyquist rate of 1.3 samples per symbol. The value $\eta$ need be chosen at least as large as the Nyquist rate. It will be argued, though, that for the memory polynomial based pre-distortion approach, it is advantageous for the number of samples per symbol to be larger than the Nyquist rate. In particular, it will be shown that the optimal sampling rate for a degree three memory polynomial pre-distorter is twice the Nyquist rate.

Second, consider the output of the PSF 16 directly inputted into the SCM chip 22. The output of the PSF 16 is a discrete signal, which is built of discrete sinusoids of frequencies in the range of $[-\pi, \pi]$ (radians/sample). The SCM chip 22 is a physical chip that operates at a sampling rate of $1/T_{samp}$ samples/second. That is, modulo the carrier frequency, the SCM chip 22 is a D/A converter that receives an input sample every $T_{samp}$ seconds, and outputs the samples at the same rate connected smoothly so that the output is an analog signal. The relationship between the discrete frequencies of the discrete input signal and the analog frequencies of the continuous output signal is:

$$\Omega=\omega T_{samp}, \quad (6)$$

where the discrete frequency $\Omega\in[-\pi,\pi]$, is in radians per sample, and the continuous frequency $\omega$ is in units of radians per second. Equivalently:

$$\omega=\Omega/T_{samp}. \quad (7)$$

In particular, if the bandwidth of the discrete signal outputted by the PSF 16 is B (radians/sample), $B\in[0,\pi]$, then the bandwidth of the associated analog signal at the output of the SCM chip 22 is $B/T_{samp}$.

The communications system is designed such that its transmitted signal occupies a particular bandwidth. The desired transmitted bandwidth can be achieved by controlling the ratio of the discrete bandwidth B to the SCM chip sampling period $T_{samp}$. The bandwidth B of the discrete signal outputted by the PSF 16 is controlled by selecting the number of samples per symbol outputted. For example, if the number of samples per symbol is precisely at the Nyquist rate ($1+\alpha$ for an SRRC with bandwidth expansion factor of $\alpha$), then the corresponding discrete signal will contain frequencies within the whole range of $[-\pi, \pi]$ radians per sample. However, if the number of samples per symbol is twice the Nyquist rate, which would be 2.6 samples/symbol for an SRRC waveform with a bandwidth expansion factor $\alpha$ of 1.3, then the output of the PSF would occupy the spectral range $[-\pi/2,\pi/2]$.

The transmitted signal is designed to reside within a finite, predetermined, bandwidth due to possible interferences with other systems or regulatory restrictions. As discussed above, the transmitted bandwidth is set by the ratio $B/T_{samp}$, where B is set by setting the number of samples per symbol outputted by the PSF 16.

Suppose that the number of samples per symbol used is twice the Nyquist rate. In this case the bandwidth B of the discrete output of the PSF 16 is $\pi/2$, i.e., the PSF output fully resides within, and fully occupies the spectral region $[-\pi/2,\pi/2]$. When the PD 20 is placed right after the PSF 16, the PD 20 expands the frequency range of the output of the PSF 16. In this example, the input to the PD 20 has a spectrum lying within the range $[-\pi/2,\pi/2]$, yet the output of the PD 20 now has a fully expanded spectrum, occupying the full frequency range $[-\pi/\pi]$. The result is that the transmitted analog signal, i.e., the output of the SCM chip 22, has an expanded bandwidth. A filter could be provided at the output of the SCM chip 22 (or the input to the receiver) restricting the analog signal to lie within a predetermined band. However, in that case frequencies that the PD 20 generated to overcome the power amplifier nonlinearities would be lost. To avoid this problem, the pre-distorter FIR filters should be restricted to operate in-band. That is, when optimizing the PD 20, the pass-band of the FIR filters must be set to be equal to the pass-band of the signal outputted by the PSF 16.

Suppose that instead the number of samples per symbol at the output of the PSF 16 was selected to equal the Nyquist rate so that the bandwidth B of the output of the PSF 16 is now $\pi$. In this case, when the PD 20 cubes its input signal, lots of aliasing occurs over the whole frequency band. The result is that the PD 20 operates on a highly aliased signal, seriously degrading the information available to it and hindering its capacity to pre-distort. Therefore, the number of samples per symbol used at the output of the PSF 16 should be higher than the Nyquist rate, so as to avoid aliasing by the PD 20.

For a degree three memory polynomial pre-distorter, the optimal rate is twice the Nyquist rate, as will be described below. Suppose the sampling rate at the output of the PSF 16 is set to equal the Nyquist rate. The PD 20, due to its cubing operation, will have to work with a highly aliased signal. As the sampling rate is increased, the pass-band of the pre-distorter FIR filters is proportionally decreased, thus throwing away some of the aliasing caused by the cubing operation. When the number of samples per symbol at the output of the PSF 16 reaches twice the Nyquist rate the aliased frequencies for the first time are fully discarded. Increasing the sampling rate beyond twice the Nyquist rate does not further improve the information available to the PD 20, it only puts unnecessary burden on the SCM chip 22 to operate at a faster sampling rate.

There is another reason why the pre-distorter taps should be optimized while restricting them to be in-band. The PD 20 is optimized based on a model of the power amplifier chain, namely, a degree three memory polynomial. In the real system, in the receiver, the zonal filter 24 throws away the unwanted harmonics added by the amplifier nonlinearities. But, the power amplifier model $\phi$, being just a degree three memory polynomial, does not have such a zonal filter. The PA model $\phi$ cubes its input, again, introducing aliasing which is not representative of the system. If the pre-distorter filter taps are not restricted to operate in-band, they will try to pre-distort artifacts of the system model, not the actual system. The result being good performance in simulation that does not transfer to good performance on the system itself.

Similarly, the PA model memory polynomial filter taps themselves should be restricted to work in-band. Otherwise the PA memory polynomial model would express aliasing artifacts that, due to the receiver zonal filter, are not representative of the real system.

As explained above, the PA model taps and the pre-distorter taps are optimized while restraining them to work in-band. Whether in determining the PA model taps or determining the pre-distorter taps, this optimization process is achieved by down-sampling the input and output signals to the Nyquist rate, determining the taps, and then up-converting the taps themselves to the number of samples per symbol generated by the PSF 16. This optimizes the PA model taps and the pre-distorter taps while restraining them to operate in-band.

Figure 4:
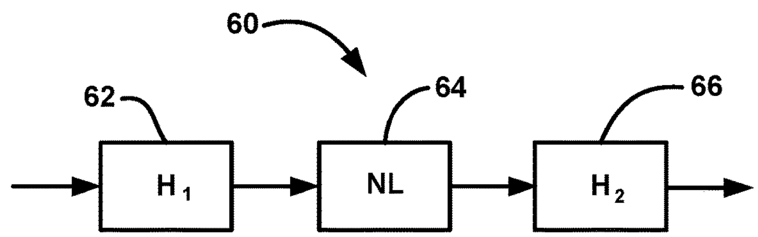
FIG. 4 is a block diagram of an architecture for a Wiener-Hammerstein model of a power amplifier.

It turns out to be advantageous at certain times to incorporate pre-equalization into the pre-distortion taps. This is most advantageous when the number of samples per symbol at the output of the PSF 16 is close to the Nyquist rate. The HPA 12 has hardware before and after it, namely, an up-converter, a down-converter and filters. The power amplifier hardware can be modeled as a memoryless nonlinearity sandwiched between two LTI filters, which is a model that in the literature is referred to as the 3-box model or the Wiener-Hammerstein model. FIG. 4 is a block diagram of an architecture 60 showing the known Wiener-Hammerstein model that includes a first LTI filter 62, a non-linear element 64 and a second LTI filter 66.

Figure 5:
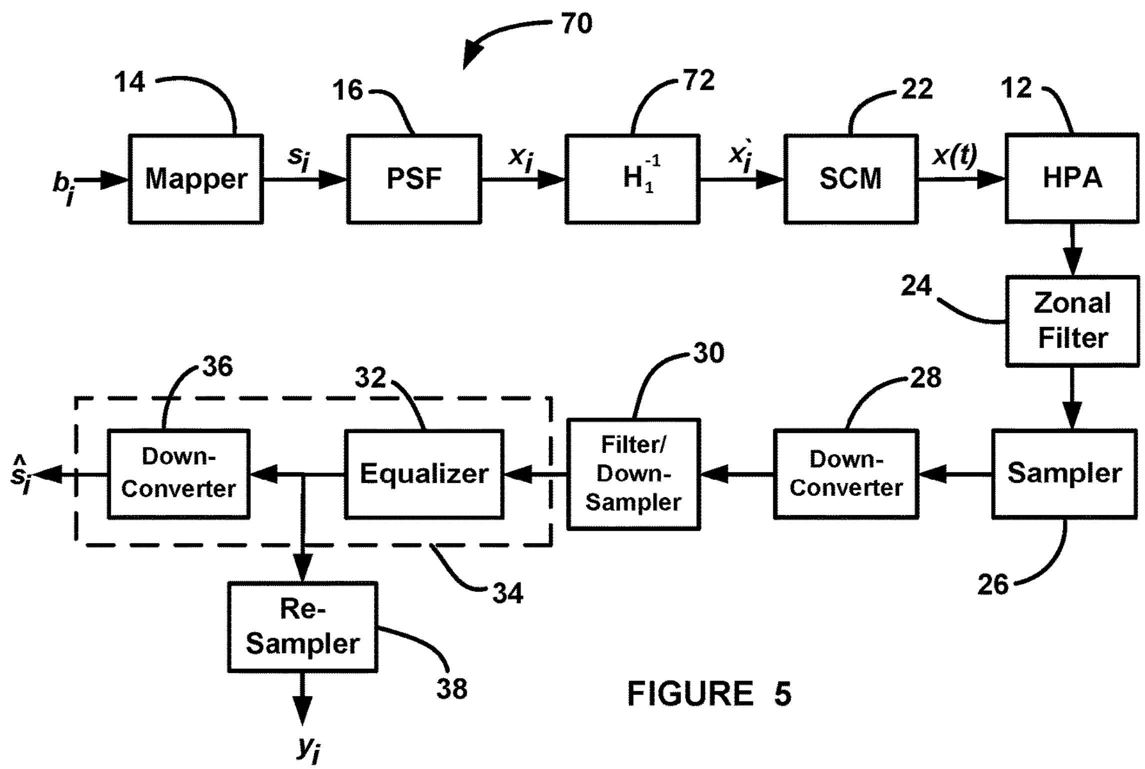
FIG. 5 is a block diagram of a communications system employing a high power amplifier and a multi-rate, iterative memory polynomial model.

In pre-equalization, an estimate of the filter $H_1$ is formed and then inverted to form the filter $H_1^{-1}$. The goal is then to incorporate the filter $H_1^{-1}$ into the PD 20. This is achieved as follows. FIG. 5 is a block diagram of a communications system 70 that is similar to the system 10 shown in FIG. 1, where like elements are identified by the same reference numeral. In this design, instead of passing the samples $x_i$ to the PD 20 to model the system, the samples $x_i$ from the PSF 16 are sent to a module 72 that inverts the filter $H_1$. A degree three memory polynomial model is then constructed relating the samples $x_i$ and $y_i$ as done previously, and a pre-distorter is formed for this model. The resulting pre-distorter taps are then convolved with the filter $H_1^{-1}$. This gives a pre-distorter which inherently inverts the filter $H_1$.

This technique proves beneficial particularly when the number of samples per symbol at the output of the PSF 16 is close to the Nyquist rate. In such a case, the PD 20 and the PA model $\phi$ both introduce significant amounts of aliasing which masks the true response of the filter $H_1$. Computing it ahead of time and incorporating it into the pre-distorter coefficients directly enables the PD 20 to diminish the effect of aliasing in training the pre-distorter taps.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for pre-distorting a digital signal in a digital communications system, said method comprising:

converting digital bits to be transmitted to a series of symbols defining the bits;

providing the symbols to a pulse shaping filter (PSF) that provides samples of the symbols at a predetermined sample rate;

providing the filtered samples to a pre-distorter that pre-distorts the samples, wherein pre-distorting the samples includes providing a non-linear transformation of the samples that is defined by pre-distorter taps, wherein pre-distorting the filtered samples in the pre-distorter includes incorporating pre-equalization into the pre-distorter taps; and providing the pre-distorted samples to a power amplifier to be amplified and transmitted, wherein pre-distorting the samples includes modeling the power amplifier and associated transmitter components using a degree three memory polynomial, and wherein modeling the power amplifier includes modeling the power amplifier as a memoryless nonlinearity sandwiched between two linear time-invariant (LTI) filters and that the pre-equalization includes providing an estimate of at least one of the LTI filters and then inverting the estimate.

2. The method according to claim 1 wherein pre-distorting the samples in the pre-distorter includes optimizing the pre-distorter by filtering the samples using finite impulse response (FIR) filters that are restricted to operate in a frequency band that is equal to the pass-band of the PSF.

3. The method according to claim 1 wherein providing samples of the symbols at a predetermined symbol rate in the PSF includes causing the number of samples per symbol at the output of the PSF to be higher than the Nyquist rate.

4. The method according to claim 3 wherein the number of samples per symbol is twice the Nyquist rate.

5. The method according to claim 1 wherein modeling the power amplifier and associated transmitter components using the polynomial includes employing indirect learning and using an iterative Gauss-Newton algorithm to refine the solution determined by the indirect learning.

6. The method according to claim 5 wherein using the iterative Gauss-Newton algorithm to refine the solution includes minimizing an error vector magnitude.

7. The method according to claim 1 wherein the associated components that are modeled with the amplifier include a single chip modulator (SCM) chip, a zonal filter, a sampler, a down-converter, a filter/down-sampler and an error vector magnitude (EVM) receiver.

8. The method according to claim 1 wherein modeling the power amplifier and associated transmitter components using the polynomial includes employing a Wiener-Hammerstein model.

9. The method according to claim 1 wherein the PSF is a square-root raised cosine PSF.

10. The method according to claim 1 wherein the communications system is a satellite communications system.

11. The method according to claim 1 wherein the polynomial model is a multi-rate, third order, odd term, iterative memory polynomial.

12. A method for pre-distorting a digital signal in a digital communications system, said method comprising:

converting digital bits to be transmitted to a series of symbols defining the bits;

filtering the symbols to provide samples of the symbols at a predetermined sample rate;

pre-distorting the filtered samples by providing a non-linear transformation of the filtered samples that is defined by pre-distorter taps, wherein pre-distorting the filtered samples includes optimizing a pre-distorter by filtering the samples using finite impulse response (FIR) filters that are restricted to operate in a frequency band that equals the pass-band of a filter that filters the samples, and wherein pre-distorting the samples includes incorporating pre-equalization into the pre-distorter taps; and amplifying and transmitting the pre-distorted samples, wherein pre-distorting the samples includes modeling amplifier and associated transmitter components using a degree three memory polynomial.

13. The method according to claim 12 wherein filtering the symbols to provide samples of the symbols includes causing the number of samples per symbol to be higher than the Nyquist rate.

14. The method according to claim 13 wherein the number of samples per symbol is twice the Nyquist rate.

15. The method according to claim 12 wherein modeling the amplifier and associated transmitter components using the polynomial includes employing indirect learning and using an iterative Gauss-Newton algorithm to refine the solution determined by the indirect learning.

16. The method according to claim 15 wherein using the iterative Gauss-Newton algorithm to refine the solution includes minimizing an error vector magnitude.

17. A method for pre-distorting a digital signal in a digital communications system, said method comprising:

converting digital bits to be transmitted to a series of symbols defining the bits;

filtering the symbols to provide samples of the symbols at a predetermined sample rate;

pre-distorting the samples by providing a non-linear transformation of the samples that is defined by pre-distorter taps; and amplifying and transmitting the pre-distorted samples, wherein pre-distorting the samples includes modeling power amplifier and associated transmitter components using a degree three memory polynomial, wherein modeling the power amplifier and associated transmitter components using the polynomial includes employing indirect learning and using an iterative Gauss-Newton algorithm to refine the solution determined by the indirect learning, and wherein using the iterative Gauss-Newton algorithm to refine the solution includes minimizing an error vector magnitude.

18. The method according to claim 17 wherein filtering the symbols to provide samples of the symbols includes causing the number of samples per symbol to be higher than the Nyquist rate.

19. The method according to claim 18 wherein the number of samples per symbol is twice the Nyquist rate.

20. The method according to claim 17 wherein the polynomial model is a multi-rate, third order, odd term, iterative memory polynomial.

21. A method for pre-distorting a digital signal in a digital communications system, said method comprising:

converting digital bits to be transmitted to a series of symbols defining the bits;

providing the symbols to a pulse shaping filter (PSF) that provides samples of the symbols at a predetermined sample rate;

providing the filtered samples to a pre-distorter that pre-distorts the samples, wherein pre-distorting the samples includes providing a non-linear transformation of the samples that is defined by pre-distorter taps, wherein pre-distorting the filtered samples in the pre-distorter includes incorporating pre-equalization into the pre-distorter taps; and providing the pre-distorted samples to a power amplifier to be amplified and transmitted, wherein pre-distorting the samples includes modeling the power amplifier and associated transmitter components using a degree three memory polynomial, and wherein the associated components that are modeled with the power amplifier include a single chip modulator (SCM) chip, a zonal filter, a sampler, a down-converter, a filter/down-sampler and an error vector magnitude (EVM) receiver.

* * * * *